US009893100B2

United States Patent
Yoneda et al.

(10) Patent No.: US 9,893,100 B2
(45) Date of Patent: Feb. 13, 2018

(54) SEMICONDUCTOR OPTICAL DEVICE INTEGRATING PHOTODIODE WITH OPTICAL WAVEGUIDE AND METHOD OF FORMING THE SAME

(71) Applicant: SUMITOMO ELECTRIC INDUSTRIES, LTD., Osaka (JP)

(72) Inventors: Yoshihiro Yoneda, Isehara (JP); Ryuji Masuyama, Kamakura (JP); Hideki Yagi, Machida (JP); Naoko Konishi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/193,814

(22) Filed: Jun. 27, 2016

(65) Prior Publication Data

US 2016/0380023 A1 Dec. 29, 2016

(30) Foreign Application Priority Data

Jun. 29, 2015 (JP) .................................. 2015-130094

(51) Int. Cl.
*H01L 31/0232* (2014.01)
*H01L 27/144* (2006.01)

(52) U.S. Cl.
CPC ................................ *H01L 27/1446* (2013.01)

(58) Field of Classification Search
CPC ............... H01L 31/0232; H01L 31/105; H01L 31/022408; H01L 31/0304; H01L 31/107; G02B 6/122; G02F 1/01708; G02F 1/025; G02F 1/035; G02F 1/225; G02F 2001/212; G02F 2201/066; G02F 2201/12; G02F 2201/17
See application file for complete search history.

(56) References Cited

U.S. PATENT DOCUMENTS

| 5,727,096 | A | * | 3/1998 | Ghirardi | .................. G02B 6/42 385/14 |
| 8,014,639 | B1 | * | 9/2011 | Skogen | .................. B82Y 20/00 385/14 |
| 2014/0070351 | A1 | * | 3/2014 | Masuyama | ....... H01L 31/02325 257/432 |

FOREIGN PATENT DOCUMENTS

JP     2001-127333     5/2001

OTHER PUBLICATIONS

S. Farwell et al., "InP Coherent Receiver Chip with High Performance and Manufacturability for CFP2 Modules", Optical Fiber Communication Conference 2014, W11.6, Mar. 2014.

\* cited by examiner

*Primary Examiner* — Trung Q Dang
*Assistant Examiner* — Frederick B Hargrove
(74) *Attorney, Agent, or Firm* — Smith, Gambrell & Russell, LLP

(57) ABSTRACT

A semiconductor optical device that integrates photodiodes (PDs) and optical waveguides coupling with the PDs and a method of forming the semiconductor optical device are disclosed. The optical waveguides in a portion in the lower cladding layer thereof provides a modified layer that forms a conduction barrier of the lower cladding layer. The modified layer is formed by converting the conduction type thereof or implanting protons therein. The modified layer prevents the electrical coupling between PDs through the waveguides.

10 Claims, 19 Drawing Sheets

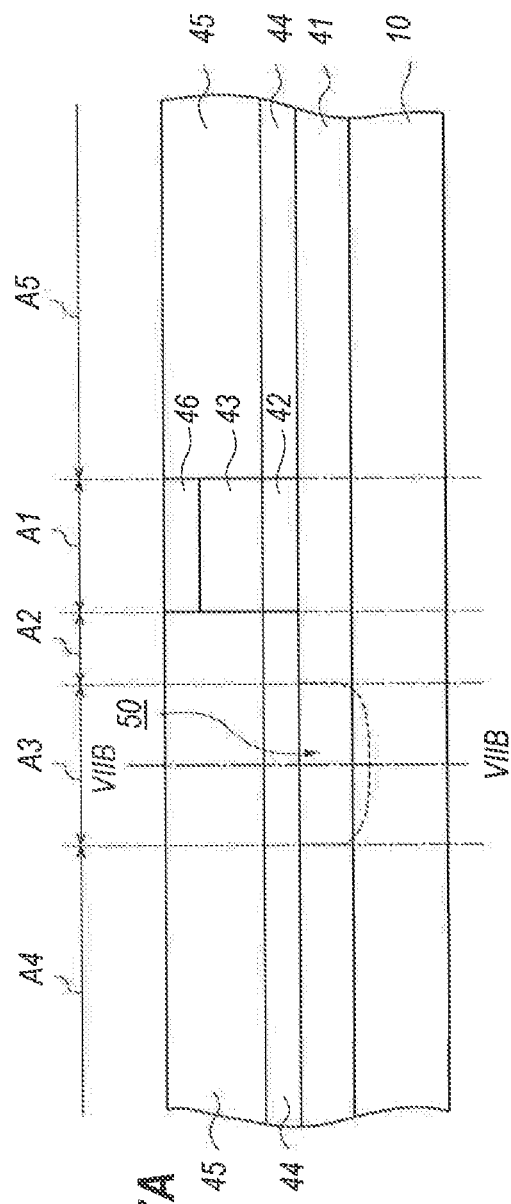
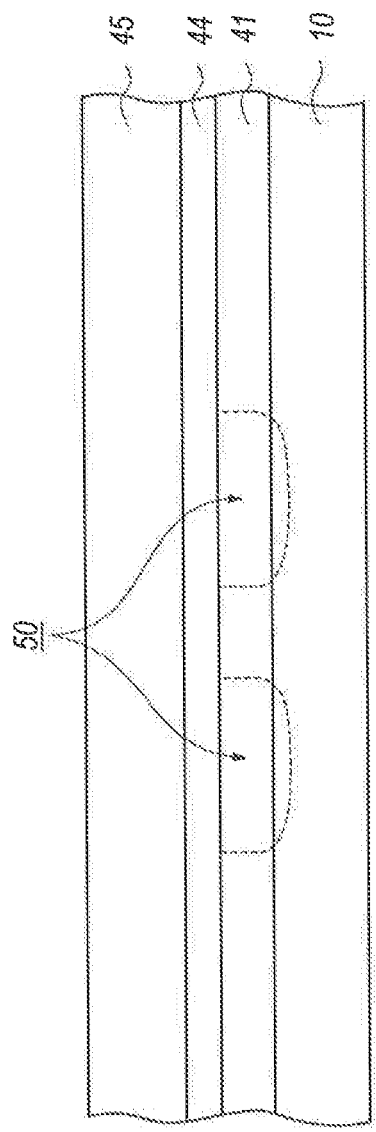
Fig. 7A
Fig. 7B

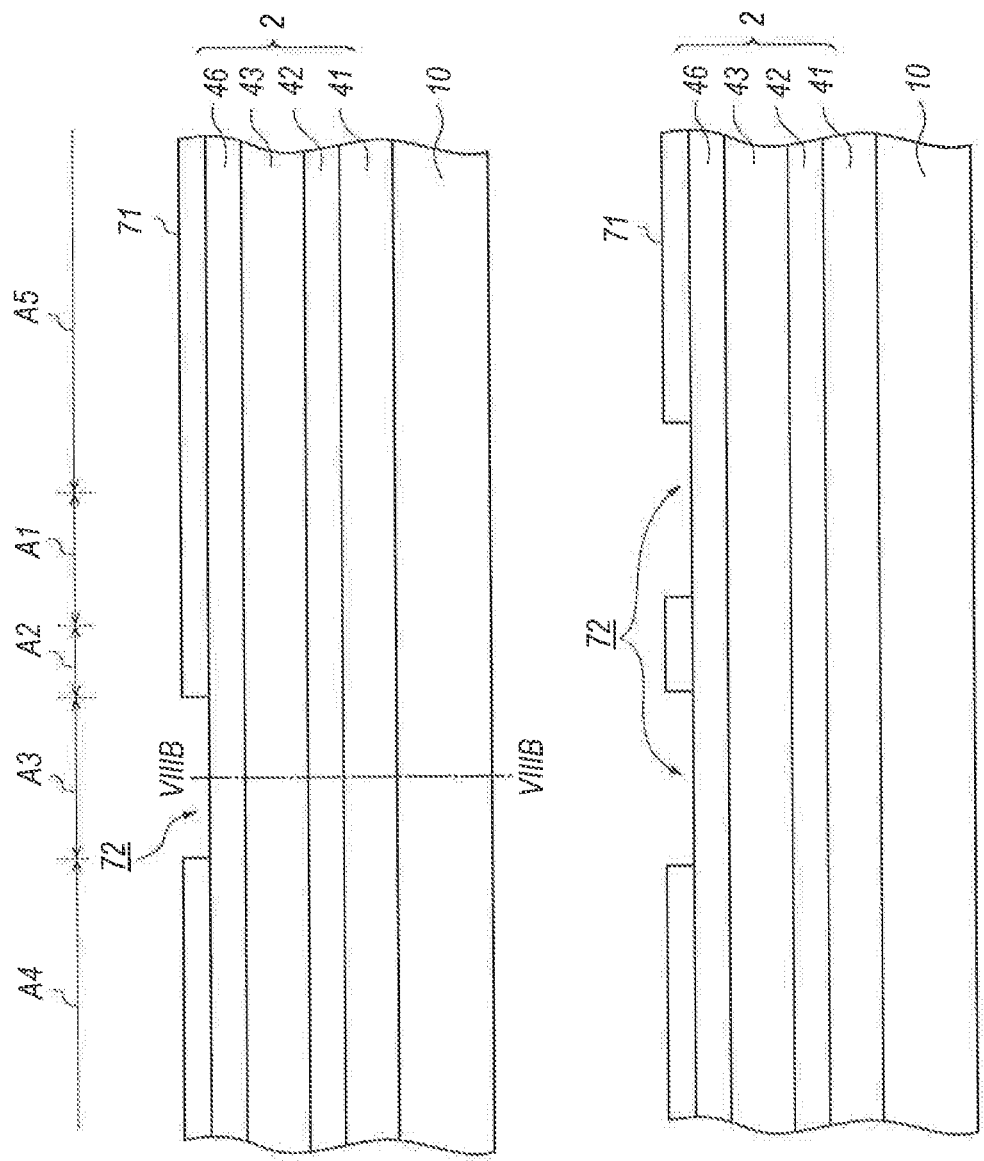

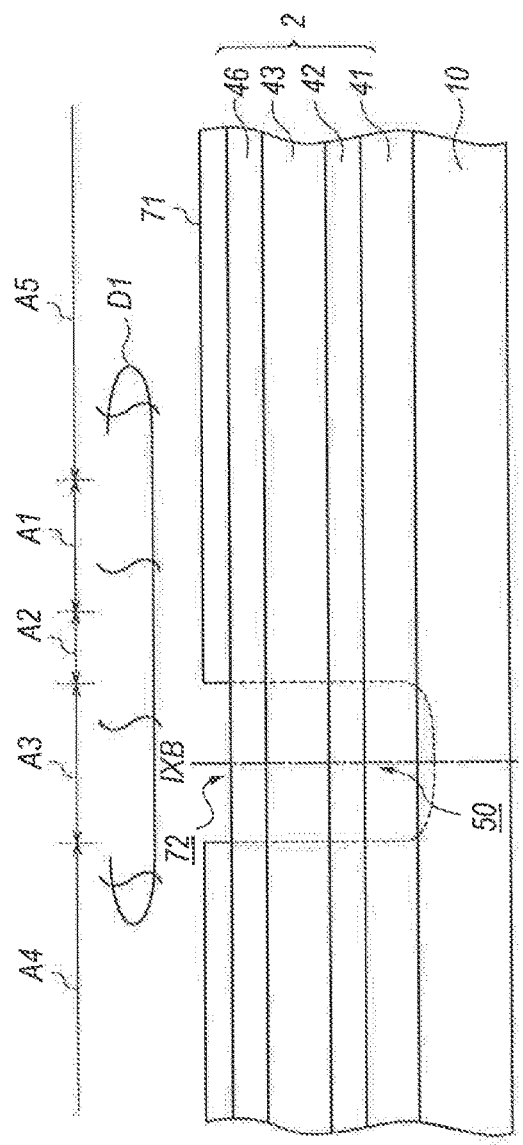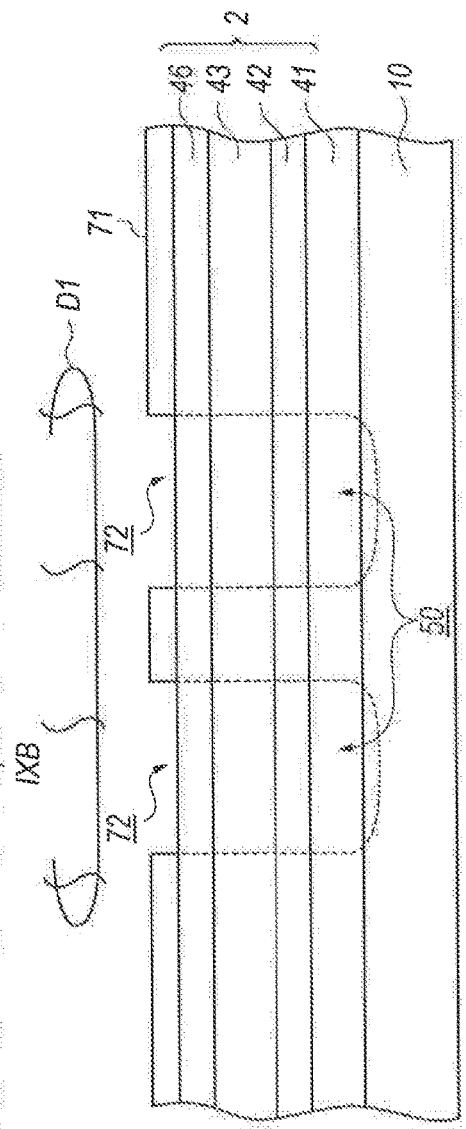
Fig. 9A
Fig. 9B

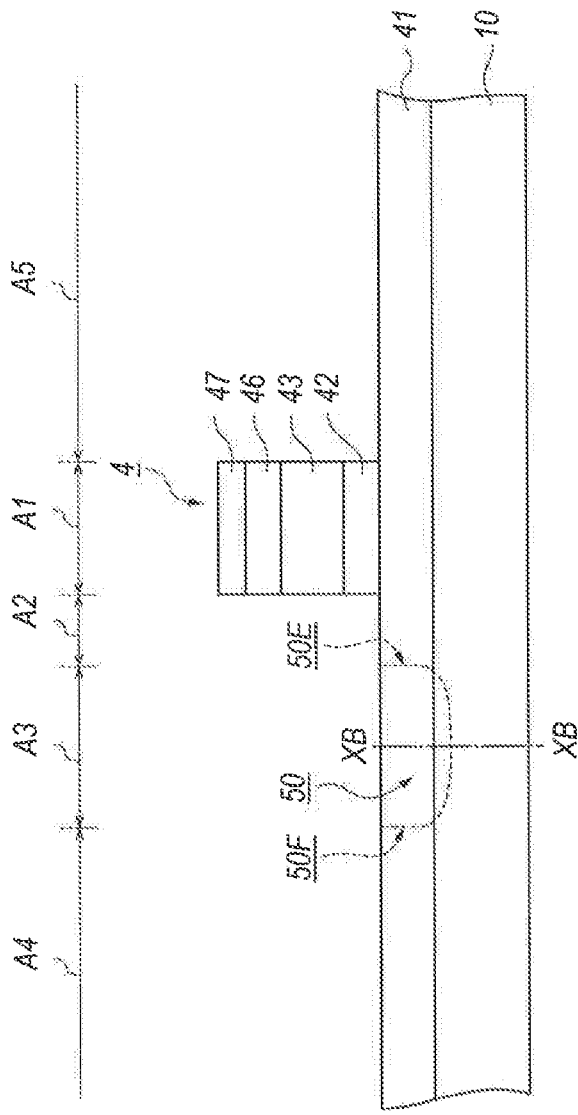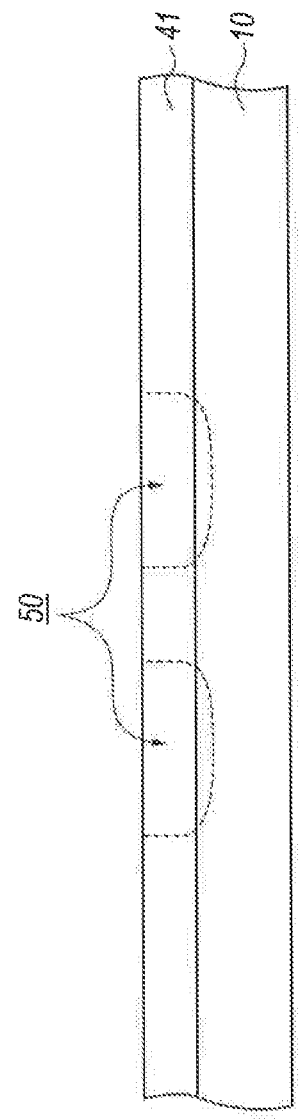
Fig. 10A
Fig. 10B

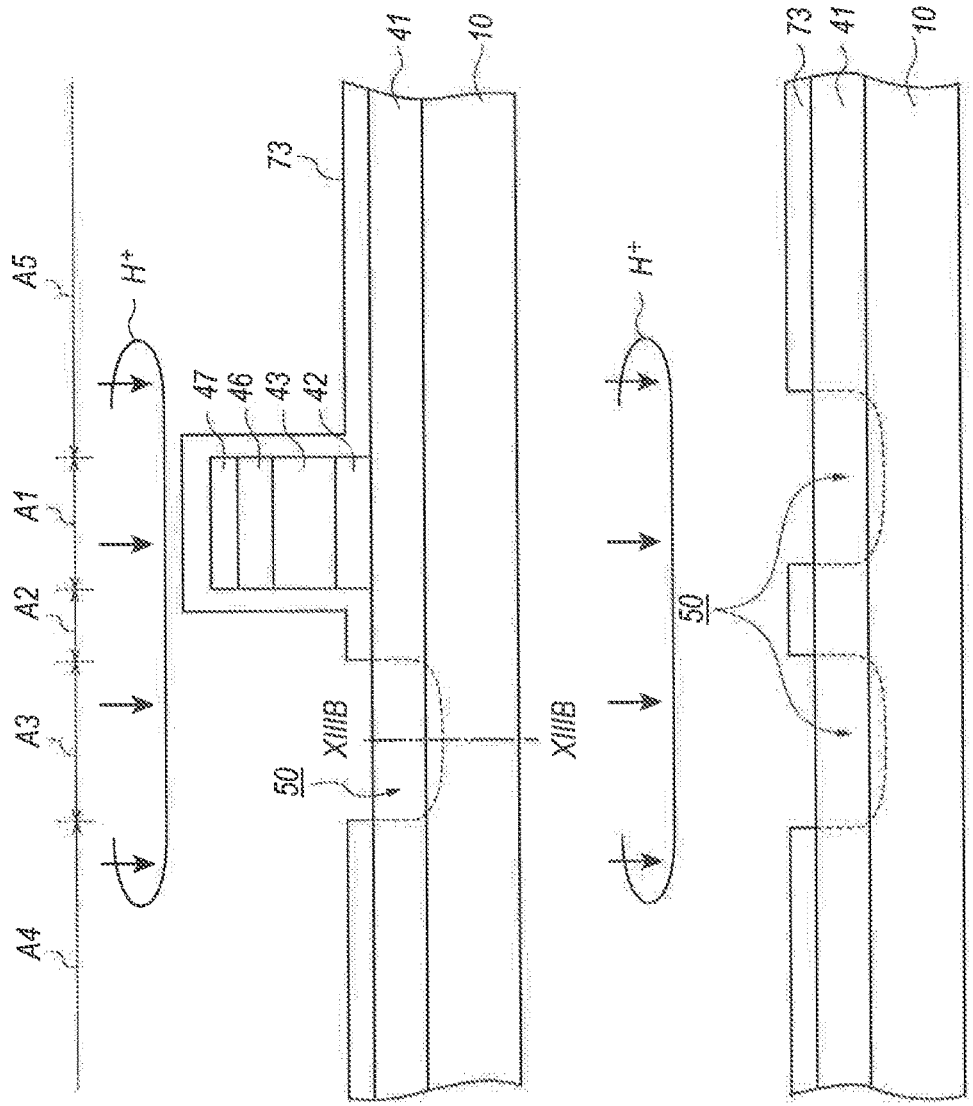

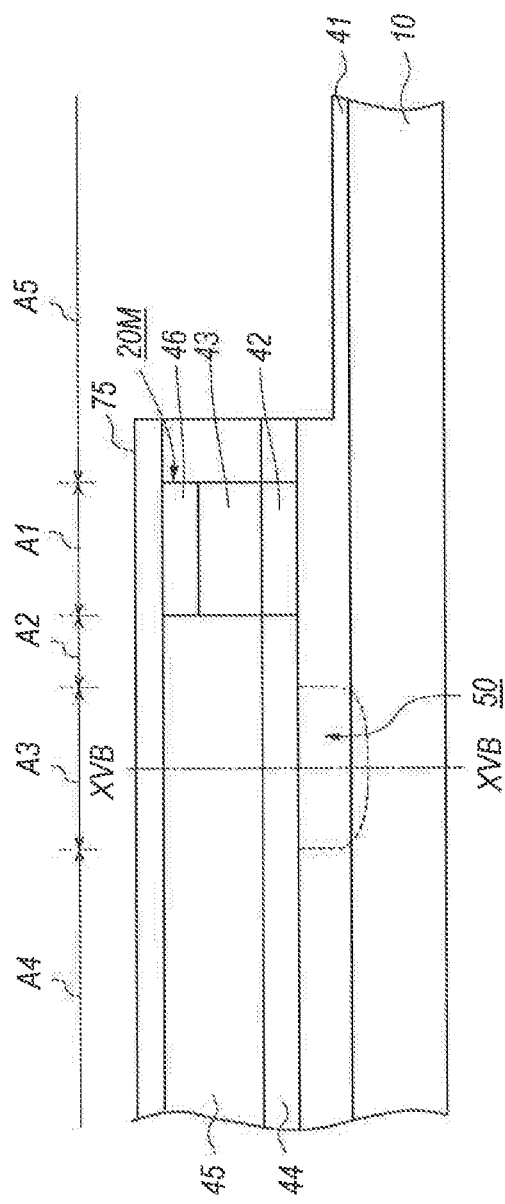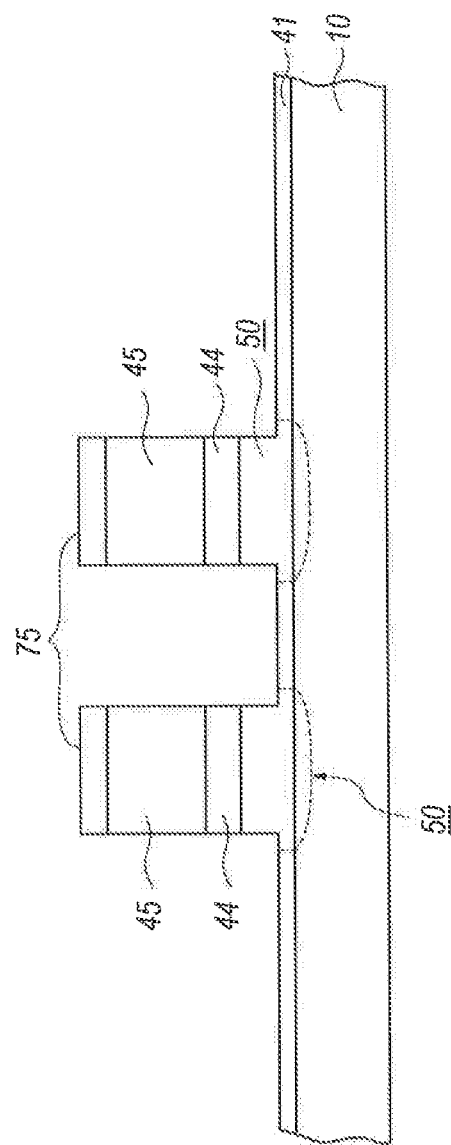

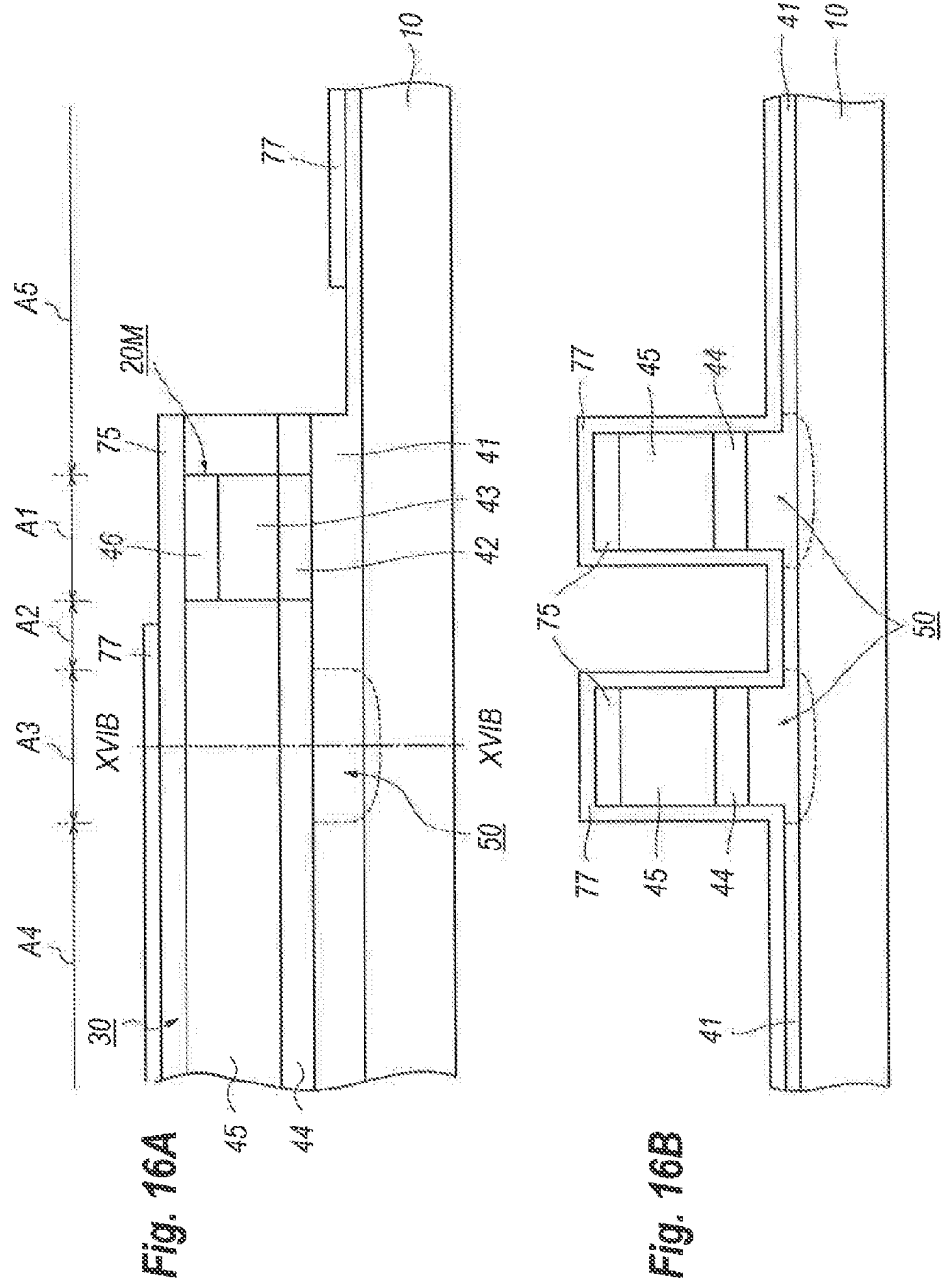

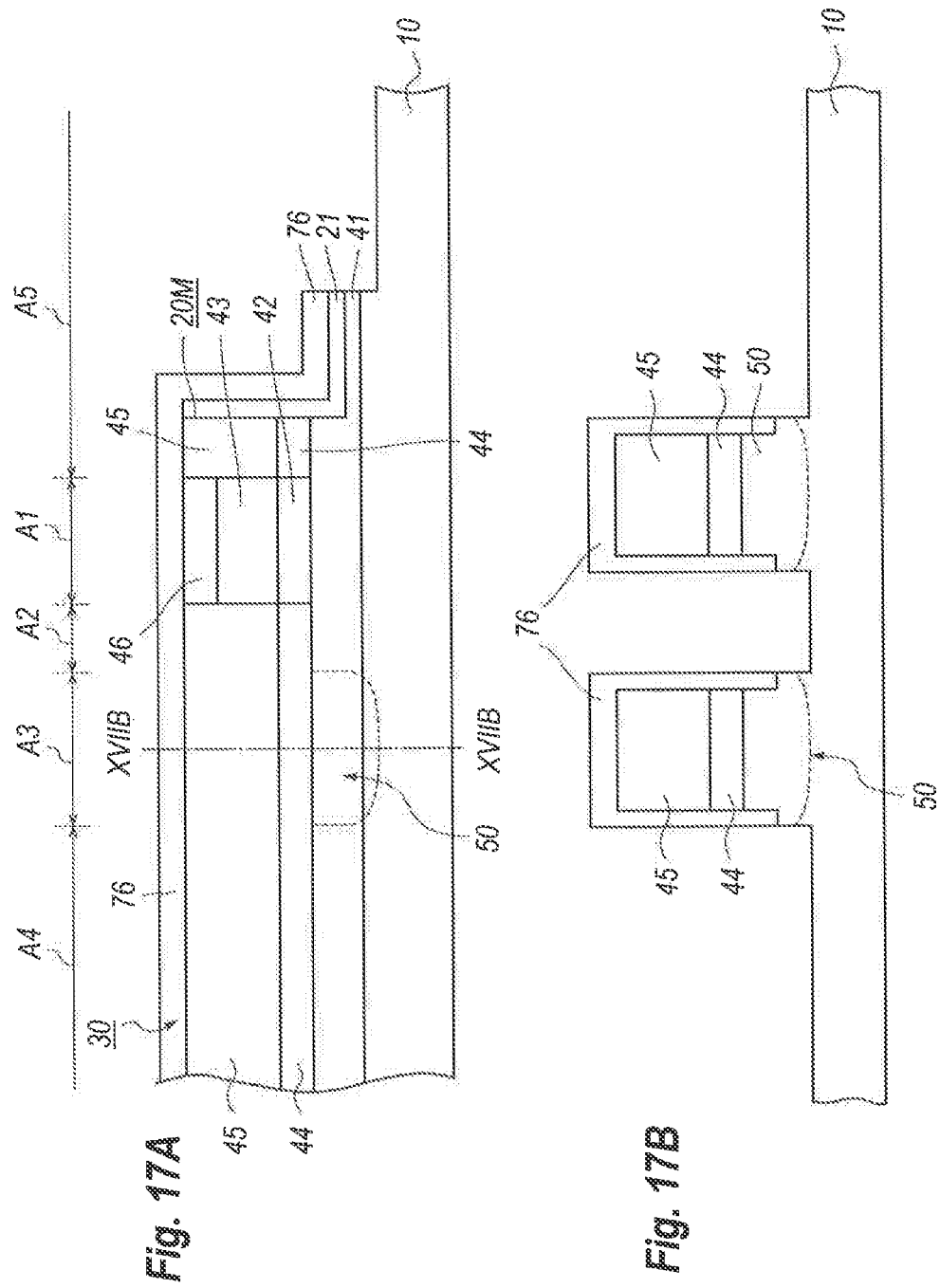

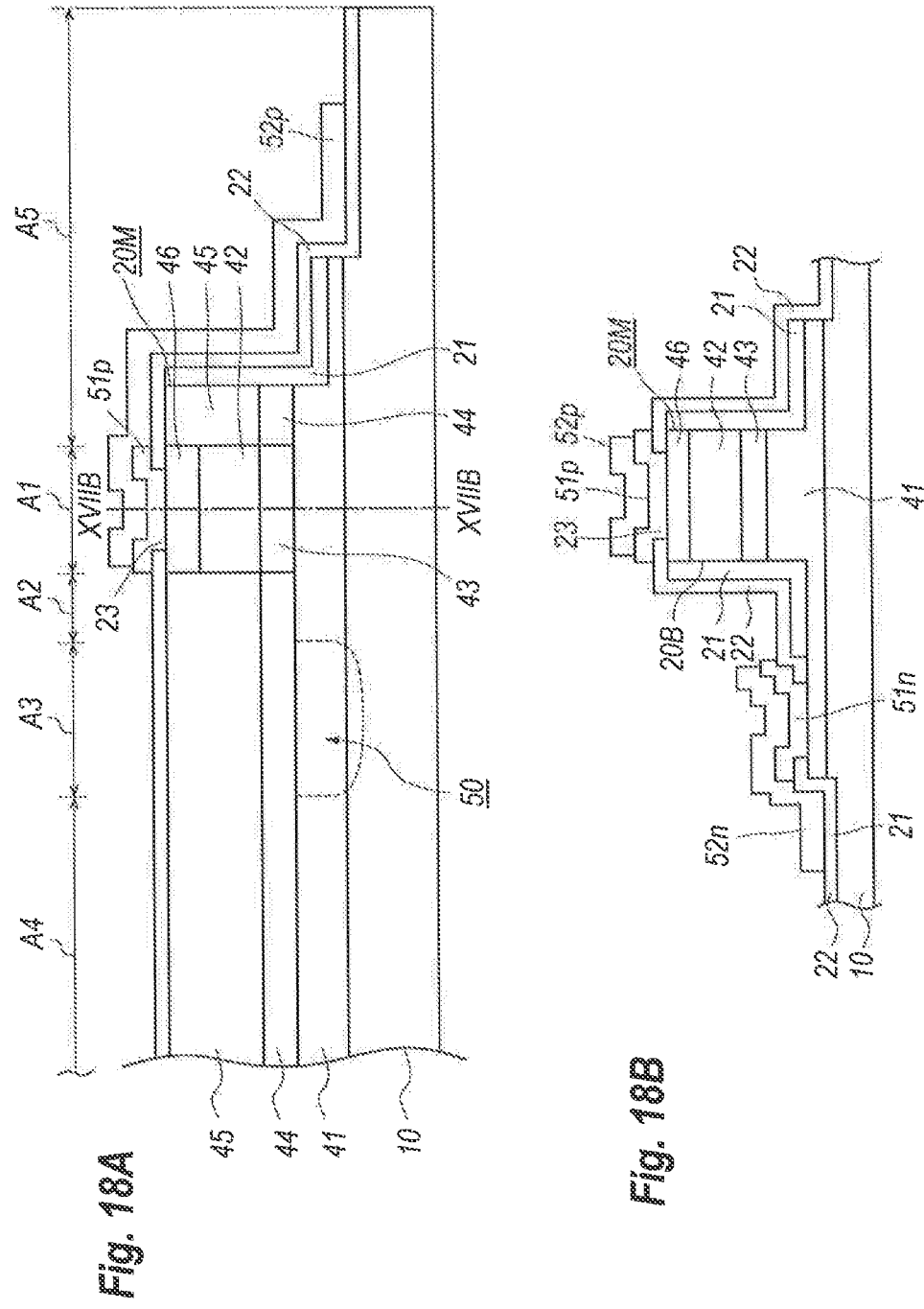

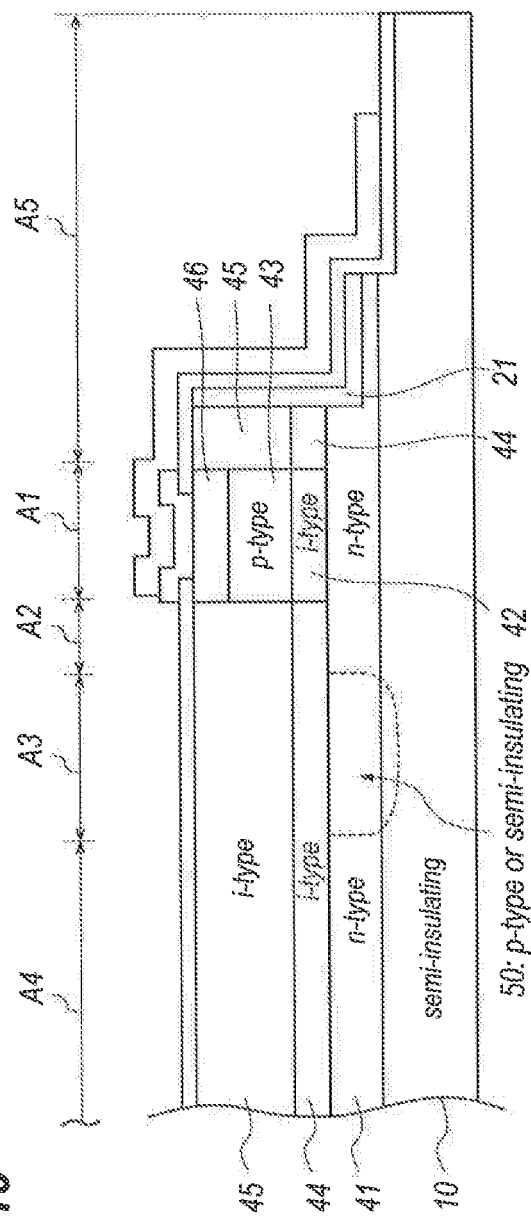

SEMICONDUCTOR OPTICAL DEVICE INTEGRATING PHOTODIODE WITH OPTICAL WAVEGUIDE AND METHOD OF FORMING THE SAME

BACKGROUND

1. Field of the Invention

The present invention relates to a semiconductor optical device and a method of forming the semiconductor optical device.

2. Prior Arts

S. Farwell et al., "InP Coherent Receiver Chip with High Performance and Manufacturability for CFP2 Modules", Optical Fiber Communication Conference 2014, USA, OSA Technical Digest, W1I.6, March 2014.

An optical device applicable to a coherent optical system provides a multi-mode interferometer (MMI) having, what is called, an optical hybrid, with a plurality of photodiodes (PDs) that convert optical signals provided from the optical hybrid into electrical signals. The PDs couple with the MMI through optical waveguides. In particular, when an MMI is integrated on a substrate with the PDs in the optical semiconductor device for the coherent optical system, conductive semiconductor layers are commonly formed in the MMI, the optical waveguides, and the PDs. The respective PDs are electrically isolated by forming trenches therebetween. That is, forming the PDs within respective mesas physically isolated from neighbor mesas by the trenches, the PDs may be electrical isolated. However, because the trenches are not extended within the optical waveguides, only existing between the PDs; electrically conduction paths are left through the conductive semiconductor layers in the optical waveguides.

SUMMARY OF THE INVENTION

An aspect of the present invention relates to a semiconductor optical device that includes a substrate, a photodiode (PD), and an optical waveguide, where the PD and the optical waveguide are integrally provided on the substrate made of semiconductor material. The PD includes first to third layers also made of semiconductor materials and stacked on the substrate in this order. The optical waveguide, which is continuous to the PD on the substrate, includes a modified layer, and fourth and fifth layers each made of semiconductor materials and stacked on the substrate. The modified layer has a thickness substantially equal to a thickness of the first layer, and the fourth layer butts against the second layer. That is, the second layer in the PD and the fourth layer in the optical waveguide form, what is called, a butt-joint. Also, the fourth layer has a bandgap wavelength shorter than a band gap wavelength of the second layer, namely, the fourth layer is substantially transparent for an optical signal subject to the PD. A feature of the semiconductor optical device of the present embodiment is that the modified layer forms a barrier for carriers conducting in the first layer.

Another aspect of the present application relates to a method of forming a semiconductor optical device that integrally includes a PD and an optical waveguide continuous to the PD on a substrate made of semiconductor material. The method includes steps of: (1) growing a first to third layers sequentially on the substrate, where the first to third layers are made of semiconductor materials, and the first and third layers have conduction types different from each other; (2) forming a modified layer in at least an area of the first layer, at which the optical waveguide is to be formed thereon, by converting the conduction type of the first layer, where the modified layer forms a pn-junction against the first layer adjacent to the modified layer; (3) forming a mesa stripe by etching the third and second layers so as to leave the first layer and the modified layer, where the mesa stripe includes the third and second layers but excludes the modified layer; (4) embedding the mesa stripe by selectively growing fourth and fifth layers sequentially on the first layer and the modified layer, the fourth and fifth layers being made of semiconductor materials different from each other, where the fourth layer butts against the second layer and has a bandgap wavelength shorter than a bandgap wavelength of the second layer; (5) forming a photodiode mesa by etching the third layer, the second layer, and a portion of the first layer, where the photodiode mesa has a height greater than a total thickness of the third layer and the second layer; and (6) forming waveguide mesa concurrently with a step of forming the photodiode mesa by etching the fifth layer, the fourth layer, and a portion of the modified layer, where the waveguide mesa having a height greater than a total thickness of the fifth layer and the fourth layer.

Still another aspect of the present application also relates to a method of forming a semiconductor optical device that integrally includes a PD and an optical waveguide continuous to the PD on a semiconductor substrate. The method includes steps of: (1) growing a first to third layers sequentially on a substrate, where the first to third layers are made of semiconductor materials; (2) forming a mesa stripe by etching the third and second layers so as to leave the first layer, where the mesa stripe includes the first to third layers; (3) forming a modified layer in an area of the first layer outside of the mesa stripe by implanting protons, where the area is adjacent to the mesa stripe and the optical waveguide is to be formed thereon, and the modified layer shows resistivity far higher than resistivity of the first layer adjacent to the modifier layer; embedding the mesa stripe by selectively growing fourth and fifth layers, each made of also semiconductor materials, sequentially on the first layer and the modified layer, where the fourth layer butts against the second layer in the mesa stripe and has a bandgap wavelength shorter than a bandgap wavelength of the second layer; (4) forming a photodiode mesa by etching the third layer, the second layer, and a portion of the first layer, where the photodiode mesa has a height greater than a total thickness of the third layer and the second layer; and (5) concurrently with a step of forming the photodiode mesa, forming a waveguide mesa by etching the fifth layer, the fourth layer, and a portion of the modified layer, where the waveguide mesa has a height greater than a total thickness of the fifth layer and the fourth layer, and the waveguide mesa is continuous to the photodiode mesa.

BRIEF DESCRIPTION OF THE DRAWINGS

The foregoing and other purposes, aspects and advantages will be better understood from the following detailed description of a preferred embodiment of the invention with reference to the drawings, in which:

FIGS. 7A and 7B show a step of forming the semiconductor optical device performed after forming the modified layer and embedding the mesa stripe for the photodiode mesa;

FIGS. 8A and 8B show a step of forming the modified layer in the first layer by converting the conduction type of the first layer according to the second embodiment of the present invention;

FIGS. 9A and 9B show a step of forming the semiconductor optical device performed subsequent to step shown in FIGS. 8A and 8B;

FIGS. 10A and 10B show a step of forming the semiconductor optical device performed subsequent to a step shown in FIGS. 9A and 9B;

FIGS. 13A and 13B show a step of forming the semiconductor optical device performed subsequent to a step shown in FIGS. 12A and 12B;

FIGS. 15A and 15B show a step of forming the semiconductor optical device performed subsequent to a step shown in FIGS. 14A and 14B, where steps shown in FIGS. 15A and 15B and subsequent figures are common to the second and third embodiments of the present invention;

FIGS. 16A and 16B show a step of forming the semiconductor optical device performed subsequent to a step shown in FIGS. 15A and 15B;

FIGS. 17A and 17B show a step of forming the semiconductor optical device performed subsequent to a step shown in FIGS. 16A and 16B;

FIGS. 18A and 18B show a step of completing the process of forming the semiconductor optical device subsequent to a step shown in FIGS. 17A and 17B; and FIG. 19 shows a structural cross section of a semiconductor optical device according to the first embodiment of the present invention.

DESCRIPTION OF EMBODIMENT

Some preferable examples of the present invention will be described as referring to drawings. In the descriptions of the drawings, numerals or symbols same with or similar to each other will refer to elements same with or similar to each other without overlapping explanations.

Figure 1:
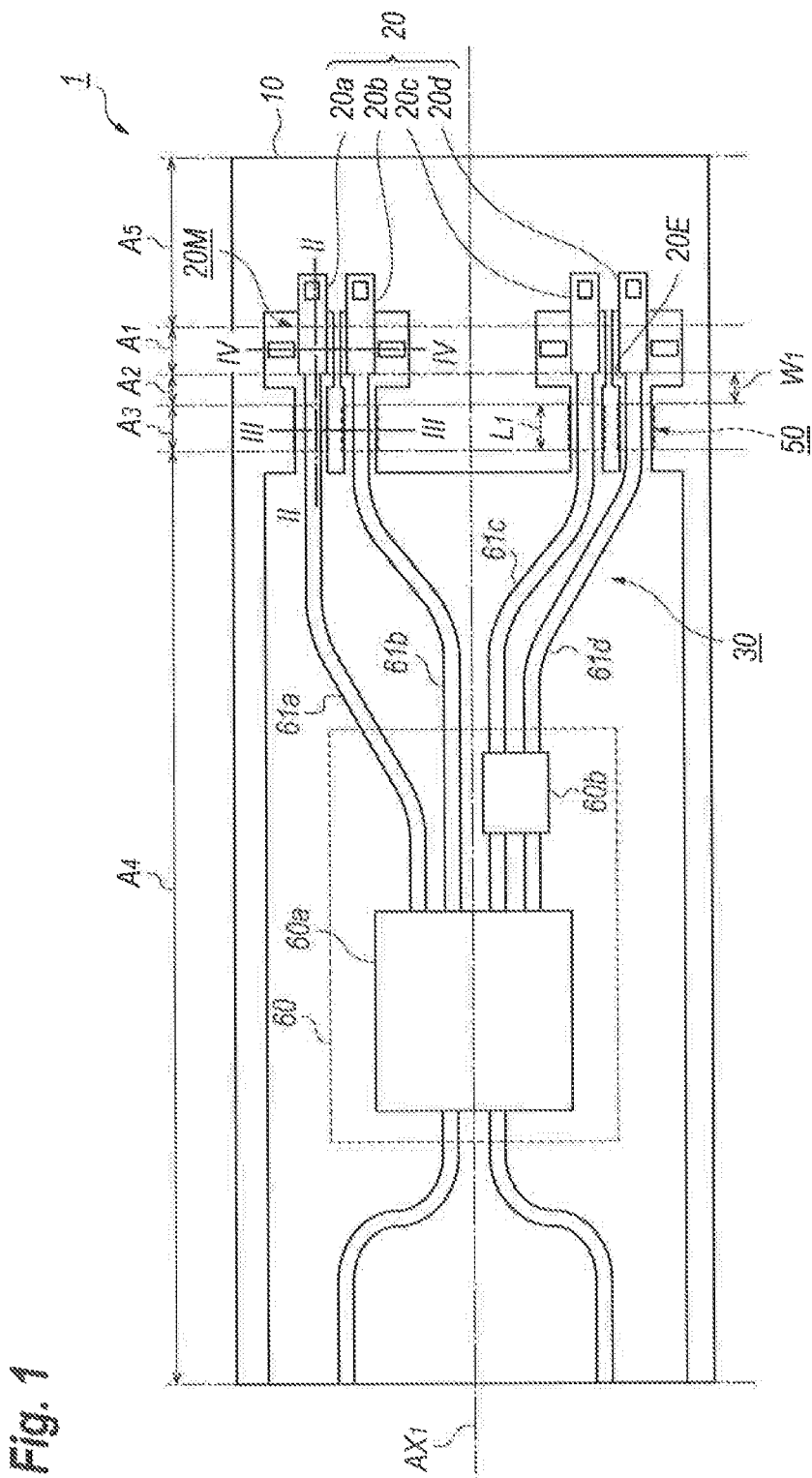
FIG. 1 schematically illustrates a plan view of a semiconductor optical device according to the first embodiment of the present invention.
Figure 2:
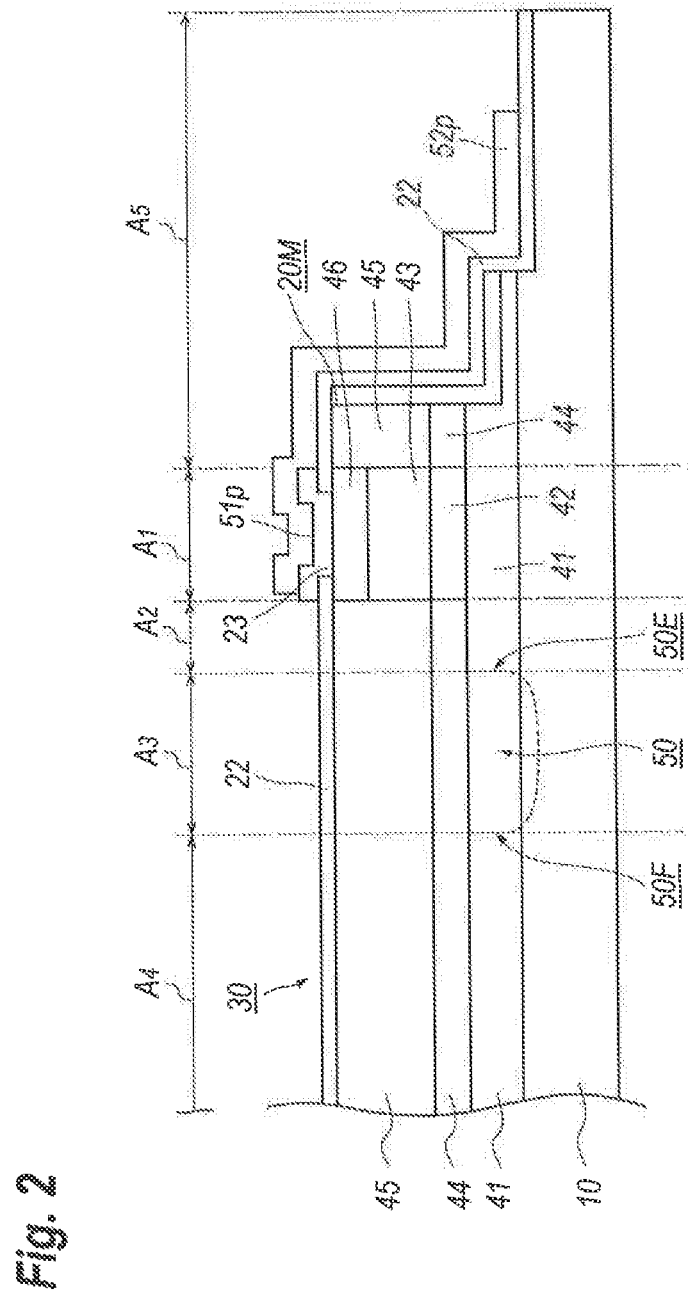
FIG. 2 shows a cross section of the semiconductor optical device taken along the line II-II indicated in FIG. 1.

FIG. 1 is a plan view of a semiconductor optical device according to the first embodiment; FIG. 2 shows a cross section taken along the line II-II indicated in FIG. 1; and FIG. 3 also shows a cross section of the semiconductor optical device but taken along the line III-III indicated in FIG. 1.

Referring to FIG. 1, the semiconductor optical device 1 includes a substrate 10, photodiodes (PDs) 20, and a waveguide mesas 30. The substrate 10 provides a top surface which is divided into first to fifth areas, $A_1$ to $A_5$. The first to fourth areas, $A_1$ to $A_4$, are arranged along an axis $AX_1$, which is a longitudinal axis of the semiconductor optical device 1 and extends substantially in parallel to an optical axis of optical waveguides. The substrate 10 may be made of semi-insulating indium phosphide (InP) doped with irons (Fe).

As illustrated in FIGS. 1 and 2, the first area $A_1$ provides the PDs 20 including four PD elements, 20a to 20d. The PD elements, 20a to 20d, are formed in respective PD mesas 20M in the first area $A_1$ and stack first to third layers, 41 to 43, where the first layer 41 has a first conduction type, while, the third layer 43 has a second conduction type opposite to the first conduction type. The first to third layers, 41 to 43, may be made of semiconductor materials.

The waveguide mesa 30 is provided in the second to fourth areas, $A_2$ to $A_4$. The waveguide mesa 30 in the second area $A_2$ includes the first layer 41, a fourth layer 44, and a fifth layer 45 arranged on the substrate 10 in this order and each being made of semiconductor materials, where the fourth layer 44 may operate as a core layer of a waveguide, while, the fifth layer 45 may show a function of an upper cladding layer against the core layer. The fourth and fifth layers in the second area $A_2$ form, what is called, a butt-joint against the second and third layers, 42 and 43, in the area $A_1$. The third area $A_3$ includes a modified layer 50, the fourth layer 44, and the fifth layer 45 stacking on the substrate 10 in this order. The fourth area $A_4$ provides a stacked arrangement of the layers identical with those in the second area $A_2$. The fourth area $A_4$ provides the multi-mode interference (MMI) coupler formed by the waveguides. The fifth area $A_5$ in a portion adjacent to the first area $A_1$ also includes the first layer 41, the fourth layer 44, and the fifth layer 45 stacked on the substrate 10 in this order. Thus, the second, fourth and fifth areas, $A_2$, $A_4$ and $A_5$ have the stacking arrangement on the substrate 10 same with each other.

As FIG. 1 illustrates, the semiconductor optical device 1 provides, in the third area $A_3$, the modified layers 50, which has an electrical characteristic different from that of the first layer 41 so as to interpose an electrical barrier between the first layers 41 in the second and fourth areas, $A_2$ and $A_4$. The modified layer 50 may prevent the PDs 20 from electrically coupling to each other through the waveguide mesa 30. The semiconductor optical device 1 may further provide isolation mesas formed so as to surround the respective PD mesas 20M and cut the first layer 41. The isolation mesas may prevent the first layer 41 from electrically coupling to the first layer 41 in the neighbor PD elements in the lateral direction of the semiconductor substrate 10. Thus, the modified layers 50 and the isolation mesas attributed surrounding the PD mesas 20M may effectively isolate the first layer 41 from the first layer 41 in neighbor PD elements. The modified layer 50 in the third area $A_3$ may be formed by at least one of doping impurities that convert the first layer 41 into the second conduction type and implanting protons ($H^+$) therein.

Doping with Impurities Converting into Opposite Conduction Type

When the first layers 41 in the second and fourth areas, $A_2$ and $A_4$, show the first conduction type, for instance, an n-type conduction; the dope of p-type impurities into the first layer 41 in the third area $A_3$ becomes effective to convert the first layer 41 into the modified layer 50 with the p-type conduction, which forms a first pn-junction 50E against the first layer 41 in the second area $A_2$ and a second pn-junction 50F against the first layer 41 in the fourth area $A_4$. Thus, an arrangement of the n-p-n structure may be formed. When the first layer 41 shows the p-type conduction, the modified layer 50 may be doped with n-type impurities to form the p-n-p structure. The n-p-n structure, or the p-n-p structure, may become a barrier for the carrier transportation, which effectively prevents the electron transportation between two n-type regions in the n-p-n structure, while, the p-n-p structure may prevent the hole transportation between two p-type regions. Thus, the first layers 41 in the second and fourth areas, $A_2$ and $A_4$, may be effectively isolated by thus formed n-p-n structure, or the p-n-p structure. A combination of the isolation mesa and the modified layer 50 may realize the effective electrical isolation between PD elements, 20a to 20d.

The present embodiment diffuses Zn atoms, which is one of p-type dopants for InP, into an n-type InP doped with silicon (Si). The Zn concentration [Zn] in the modified semiconductor layer after the diffusion of Zn atoms becomes, for instance, $1 \times 10^{17}$ cm$^{-3}$ to $2 \times 10^{18}$ cm$^{-3}$, which is higher than the Si concentration [Si] of, for instance, $5 \times 10^{16}$ cm$^{-3}$ to $1.5 \times 10^{18}$ cm$^{-3}$. A diffusion process of Zn atoms may be carried out by conditions of, for instance, a di-methyl-zinc as a source gas for the Zn diffusion and a diffusion temperature of 550 to 650° C.

Implanting Protons

When the modified layer 50 is formed by implanting protons H$^+$; the implanted protons H$^+$ induces a lot of defects within the first layer 41 to convert the layer into the modified layer 50. Implanted protons are left as interstitials between the host atoms in the modified layer 50; accordingly, the proton concentration [H$^+$] in the modified layer 50 becomes higher than those in the first layers 41 in the second and fourth areas, $A_2$ and $A_4$. The proton interstitials and damages caused by the implanted protons increase resistivity of the modified layer 50 compared with that of the first layers 41 in the second and fourth areas, $A_2$ and $A_4$. Accordingly, the modified layer 50 may show a function of the conduction barrier between the first layers 41 of the second area $A_2$ and that of the fourth area $A_4$. Thus, a coupling between the PD elements through the waveguide mesas 30 may be effectively prevented by the modified layer 50.

The present embodiment implants protons into the Si-doped n-type InP layer to modify the first layer 41, which increases the proton concentration, namely, hydrogen concentration in the modified InP layer converted from the n-type InP layer, for instance, from $1 \times 10^{18}$ to $1 \times 10^{19}$ cm$^{-3}$. The dosage of the protons is, for instance, from $5 \times 10^{14}$ to $5 \times 10^{15}$ cm$^{-2}$, and the acceleration voltage thereof from 50 to 400 keV. The original n-type InP layer not implanted with protons has the hydrogen concentration, equivalently to the proton concentration, from $1 \times 10^{17}$ to $1 \times 10^{18}$ cm$^{-3}$.

Figure 3:
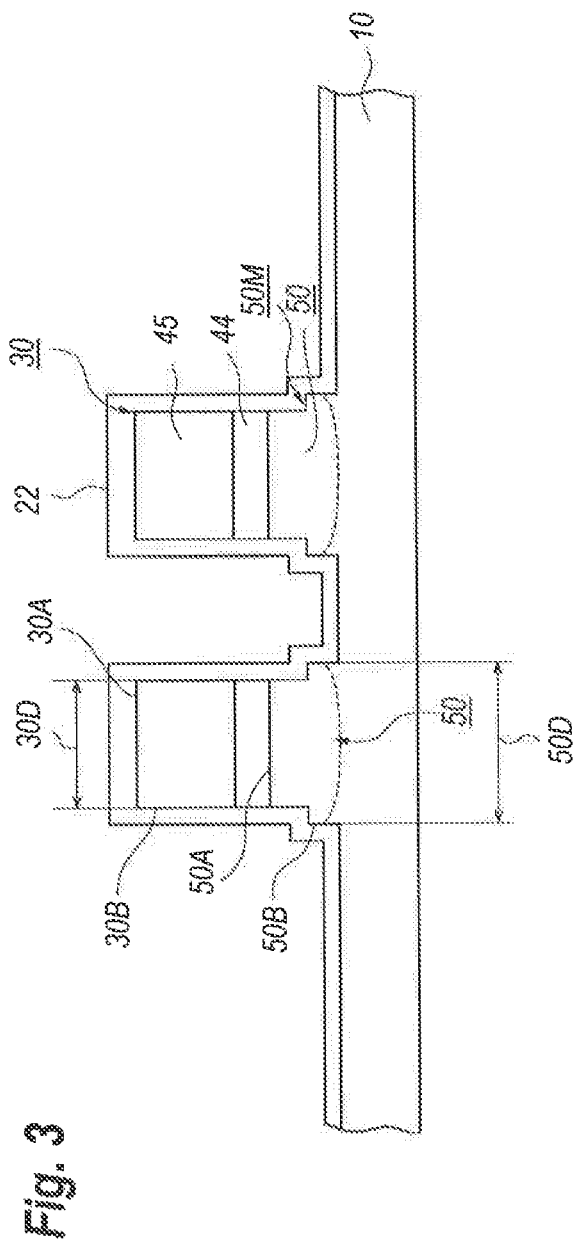
FIG. 3 shows a cross section of the semiconductor optical device taken along the line III-III indicated in FIG. 1.

The waveguide mesa 30 in the structure thereof along the line III-III indicated in FIG. 1 will be described as referring to FIG. 3. The waveguide mesa 30 stacks the modified layer 50, the fourth 44, and the fifth 45 in this order in the third area $A_3$. The modified layer 50 in a portion thereof extends within the isolation mesa 50M. The insulating layer 22 covers the top 30A and the sides 30B of the waveguide mesa 30, and the side 50B of the isolation mesa 50M. The insulating layer 22 may be made of inorganic material containing silicon (Si), typically, silicon nitride (SiN), silicon oxide (SiO$_2$), silicon oxy-nitride (SiON), and so on.

The modified layer 50 wholly extends along the width 50D in the isolation mesa 50M. Also, the modified layer 50 has a thickness from the top 50A thereof to the semi-insulating substrate 10, which means that the isolation mesa 50M includes no first layer 41 which is not converted into the modified layer 50 at least in the cross section of the isolation mesa 50M. Thus, the modified layer 50 in the third area $A_3$ may electrically isolate the first layer 41 in the second area $A_2$ from the first layer 41 in the fourth area $A_4$.

The fourth layer 44, which may be made of undoped InGaAsP, extends on the modified layer 50 in the third area $A_3$, the first layer 41 in the second area $A_2$, and the first layer 41 in the fourth area $A_4$. Because an i-type semiconductor layer substantially shows an electrically insulating characteristic, the i-type fourth layer 44 may become an electrical barrier between the first layer 41 in the second layer $A_2$ and the first layer 41 in the fourth area $A_4$ in spite of these first layers 41 in the second and fourth areas, $A_2$ and $A_4$, couple to each other through the i-type core layers 44 in the second to fourth areas, $A_2$ to $A_4$. Thus, no electrical paths that detour the modified layer 50 may be formed between the first layers 41 in the second and fourth areas, $A_2$ and $A_4$.

Practical widths, 50D and 30D, of the isolation mesa 50M and the waveguide mesa 30, respectively, in the third area $A_3$ are shown in the table below.

| bottom width 50D | 2.5 to 5.0 μm |
| top width 30D | 1.5 to 3.0 μm |

Thus, the bottom width 50D, the width of the isolation mesa 50M is wider than the top width 30D, the width of the waveguide mesa 30, by about one (1) μm. Referring to FIG. 1, a distance $W_1$ between the modified layer 50 and the edge 20E of the PD mesa 20M may be about ten (10) μm, and the modified layer 50 may have a length $L_1$ of, for instance, 100 μm along the optical axis $AX_1$.

The fourth area $A_4$ includes a waveguide structure for the MMI coupler 60, which is often called as a 90° hybrid, that provides one or more input ports and a plural output ports The MMI coupler 60 of the present embodiment includes one 2×4 MMI coupler 60a and one 2×2 MMI coupler 60b. The MMI coupler 60 outputs de-modulated optical signals into the waveguides, 61a to 61d, optically coupling the output ports of the MMI coupler 60 with the PD 20 that converts the de-modulated optical signals into electrical signals.

A table below summarizes an exemplary structure of the semiconductor optical device shown in FIGS. 1 to 3.

| substrate 10 first area $A_1$ | iron (Fe) doped semi-insulating InP |
|---|---|
| first layer 41 (cathode) | silicon (Si) doped n-type InP |
| second layer 42 | undoped GaInAs, or undoped GaInNAs |
| third layer 43 (anode) | zinc (Zn) doped p-type InP |
| second and fourth areas, $A_2$ and $A_4$ | |
| first layer 41 | Si doped n-type InP |
| fourth layer 44 | undoped GaInAsP with $\lambda_{BG}$ of 1.05 μm |
| fifth layer 45 | undoped InP |
| third area $A_3$ | |
| modified layer 50 | zinc (Zn) diffused or proton (H$^+$) implanted InP |
| fourth layer 44 | undoped GaInAsP with $\lambda_{BG}$ of 1.05 μm |
| fifth layer 45 | undoped InP |

A symbol $\lambda_{BG}$ means a bandgap wavelength that corresponds to bandgap energy of a semiconductor material. As shown in the table above, the fourth layer, namely, the core layer of the optical waveguide, has the band gap wavelength of 1.05 μm shorter than that of the second layer, namely, un-doped GaInAs whose band gap wavelength is 1.55 μm or longer. That is, the fourth layer 44 is substantially transparent for an optical signal subject to the PD formed in the first area $A_1$. Also, the fifth layer has refractive index smaller than that of the fourth layer, which may form an optical wave-guiding structure.

The PD 20 may further provide a sixth layer 46 with the second conduction type on the third layer 43. The sixth layer 46 may be made of p-type InGaAs containing p-type dopants, typically zinc (Zn). Also, the PD 20 may further provide, between the first layer 41 and the second layer 42, between the second layer 42 and the third layer 43, and/or between the third layer 43 and the sixth layer 46, intermediate layers that moderate a hetero barrier formed between those semiconductor layers. A such intermediate layer may be made of for instance, InGaAsP with optionally selected in respective compositions.

Figure 4:
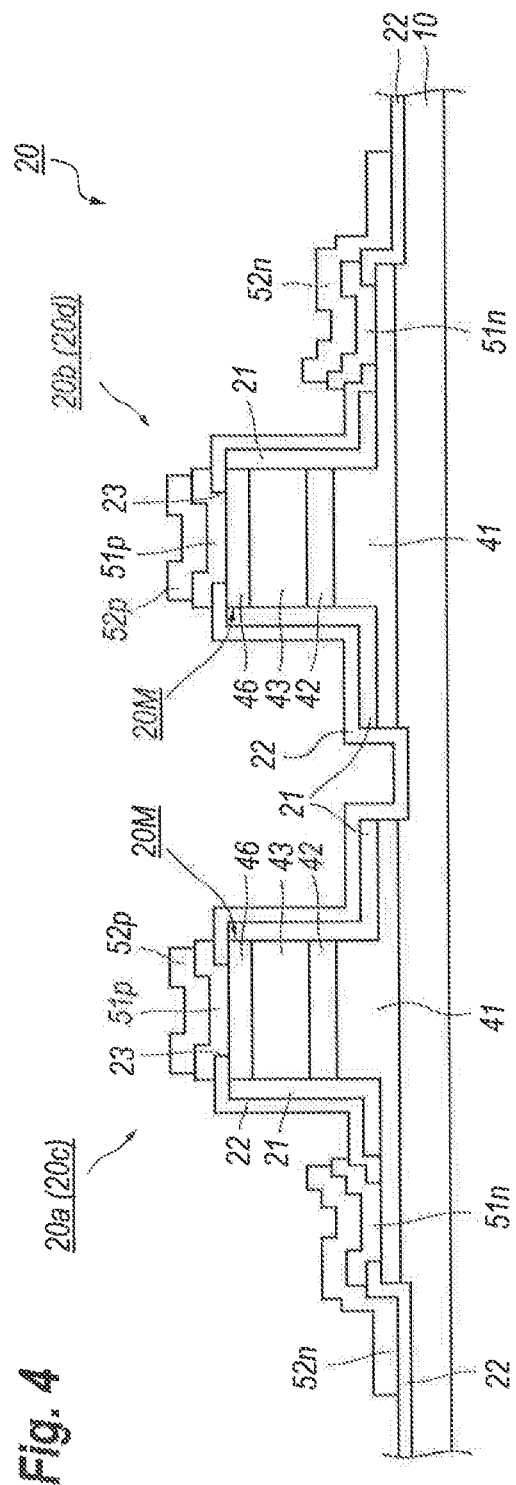
FIG. 4 shows a cross section of the semiconductor optical device taken along the line IV-IV indicated in FIG. 1.

Referring to FIG. 4, which shows a cross section taken along the line IV-IV indicated in FIG. 1, the PD 20 provides a embedding layer 21 that covers sides of the PD mesa 20M. The embedding layer 21 may be made of iron (Fe) doped semi-insulating InP. The insulating layer 22, which may be made of inorganic material containing silicon (Si), typically, silicon nitride (SiN), silicon oxide ($SiO_2$), silicon oxy-nitride (SiON), and so on, covers the embedding layer 21 and the top of the PD mesa 20M as leaving an opening 23. An anode 51p, which may be a eutectic metal of AuZn or an alloy containing platinum (Pt), is in contact to the sixth layer 46 through the opening 23. Provided on the anode 51p is an interconnection 52p made of gold (Au). An end of the interconnection 52p opposite to the PD mesa 20M may provide a pad to which a wire-bonding is to be carried out.

In the first area $A_1$, no first layer 41 exists in a portion between the PD elements, 20a and 20b. That is, the PD elements, 20a and 20b, may be electrically isolated from neighbor PD elements. The substrate 10 in a top thereof between the PD elements is covered with the insulating layer 22 without being covered with the first layer 41. The PD elements, 20a and 20b, provide respective cathodes 51n accompanying respective interconnections 52n whose ends opposite to the cathodes 51n provide pads to which the wire-boding is carried out. The cathode 51n may be a eutectic metal of AuGe or alloy containing a eutectic metal, typically, AuGeNi; while, the interconnections 52n are primarily made of gold (Au).

Figure 5:
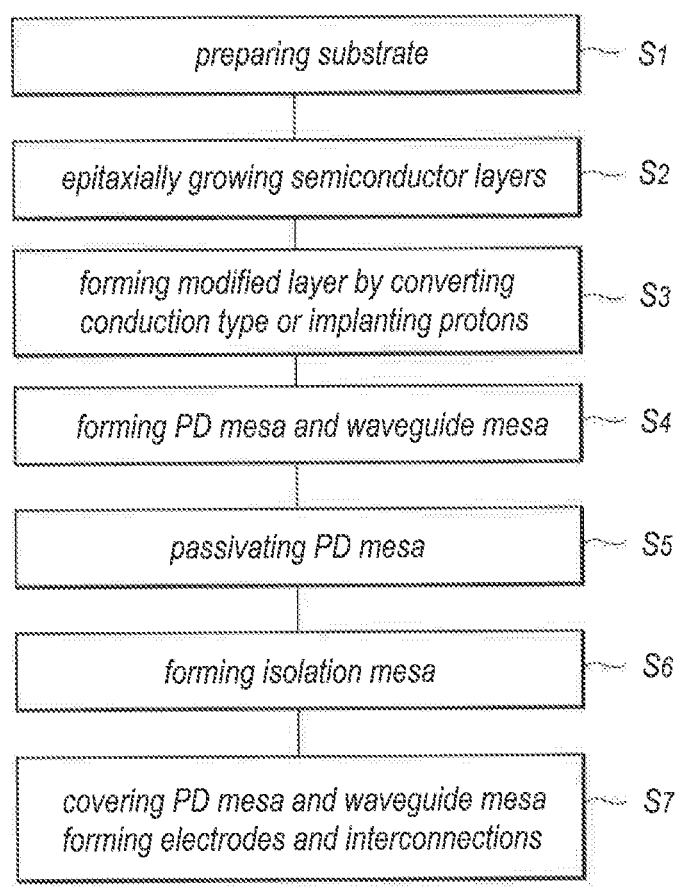
FIG. 5 shows a flow chart of the process of forming the semiconductor optical device of the first embodiment shown in FIG. 1.
Figure 6A:
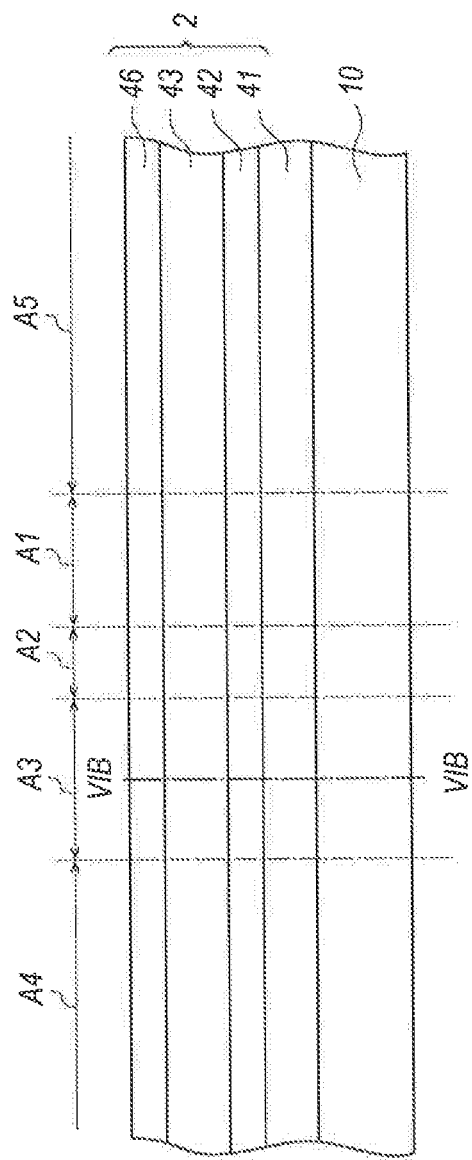
FIGS. 6A and 6B show the first step of forming the semiconductor optical device shown in FIG. 1.
Figure 6B:
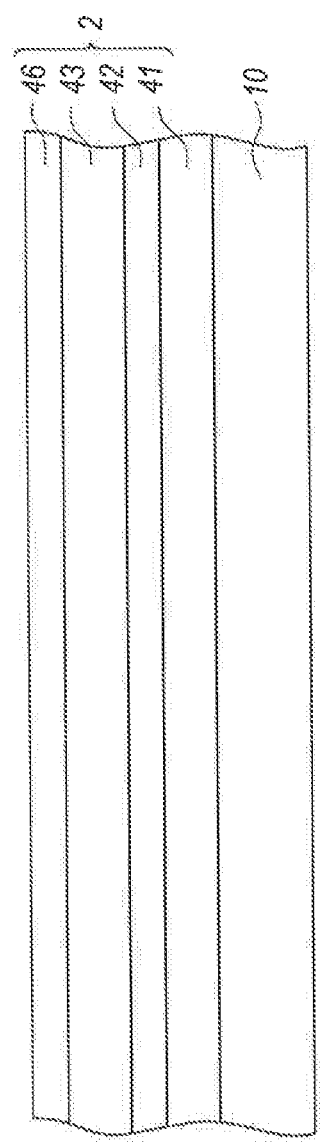

Next, a process of forming the semiconductor optical device will be described. FIG. 5 shows a flow chart of the process according to an embodiment of the present invention; and FIGS. 6 to 17 show respective steps of the process, where parts A in respective figures, FIGS. 6A to 17A, show cross sections taken along the line II-II indicated in FIG. 1; while, parts B in respective figures, FIGS. 6B to 17B, show cross sections taken along the lines, VIB-VIB to XVIIB-XVIIB, appearing in respective figures, FIGS. 6A to 17A.

Preparing Substrate and Growing Layers

The step $S_1$ prepares a substrate 10 that includes first to fifth areas, $A_1$ to $A_5$. The step $S_2$ shown in FIGS. 6A and 6B grows semiconductor layers, 41 to 46, on the substrate 10; specifically, the process forms the semiconductor stack 2 by growing the first to third layers, 41 to 43, and the six layer 46 sequentially on the substrate 10 in this order by, for instance, the organic metal vapor phase epitaxy (OMVPE) technique or the molecular beam epitaxy (MBE). The third layer 43 has a conduction type different form that of the first layer 41. The second layer 42 may be an absorption layer, that is, the first to third layers, 41 to 43, may form an n-i-p structure, or a p-i-n structure for a photodiode.

The process may grow the sixth layer 46 on the third layer 43 that has the second conduction type same with that of the third layer 43. The sixth layer 46 may be made of zinc (Zn) doped indium gallium arsenide (InGaAs) to be operable as a contact layer for the anode 51p. Also, the process may form intermediate layers between the first layer 41 and the second layer 42, between the second layer 42 and the third layer 43, and between the third layer 43 and the sixth layer 46 to moderate hetero-barriers between those layers. Thicknesses of the first, the second, and the third layers are:

| | |
|---|---|
| $1^{st}$ layer 41 | 1.5~3.0 μm |
| $2^{nd}$ layer 42 | 0.2~0.5 μm |
| $3^{rd}$ layer 43 | 1.5~3.0 μm |

Forming Modified Layer

The third step $S_3$ shown in FIGS. 7A and 7B converts the first layer 41 in the third area $A_3$ into the modified layer 50. The conversion of the first layer 41 in the third area $A_3$ may be carried out by one of doping dopants that converts the first conduction type of the first layer 41 into the second conduction type, or implanting protons. Processes of step $S_3$ and subsequent thereto depend on which technique is carried out. The explanation below assumes that a step of converting the conduction type will be denoted as the step $S_{3-1}$, while, another technique of implanting protons will be denoted as the step $S_{3-2}$.

Converting Conduction Type of First Layer

The step of forming the modified layer 50 by converting the conduction type will be first described as step $S_{3-1}$. As step $S_{3-1}$ shown in FIGS. 8A and 8B, the process forms a patterned mask 71 on the semiconductor stack 2, where the patterned mask 71 provides openings 72 in the third area $A_3$. The patterned mask 71 may be made of inorganic material, typically, silicon nitride (SiN). Then, p-type dopants are thermally diffused into the semiconductor stack 2 through the opening 72. The p-type dopants may be, for instance, zinc (Zn). Zn atoms may diffuse into the first layer 41 and reach the substrate 10, which may convert the first layer 41 into a p-type layer, as shown in FIGS. 9A and 9B. After the thermal diffusion of the p-type dopants, the patterned mask 71 is removed. When the patterned mask 71 is made of SiN, buffered hydrofluoric acid (BHF) may solve silicon nitride (SiN).

After the removal of the patterned mask 71, the process selectively etches portions of the semiconductor stack 2 to form a mesa stripe 4 as shown in FIGS. 10A and 10B. Specifically, the process forms another patterned mask 47 that extends along the direction perpendicular to the optical axis of the optical waveguide, and selectively etches the semiconductor stack 2 by, what is called, a wet-etching so as to leave the whole first layer 41, and from the second layer 42 to the sixth layer 46 in the areas out of the first area $A_1$. The left layers of the second and third layers, 42 and 43, and the sixth layer 46 may form the mesa stripe 4. The patterned mask 47 is to be used in a step subsequent to the selective etching of the present step. The wet-etching of the present step uses an etchant containing at least a chloric acid and an acetic acid, or another etchant containing at least a sulfuric acid and a hydrogen peroxide. The patterned mask 47 used in the present step may made of, for instance, silicon nitride (SiN).

The process for thermally diffusing the dopants may convert the first layer 41 in the conduction type thereof into the modified layer 50 having the second conduction type which is opposite to the conduction type of the original first layer 41. Thus, the modified layer 50 may form the first pn junction 50E against the first layer 41 in the second area $A_2$ and the second pn junction 50F against the first layer 41 in the fourth area $A_4$. The two pn-junctions, 50E and 50F, may become a conduction barrier for carriers in the first layers 41 in the second and fourth areas, $A_2$ and $A_4$, and electrically isolate the first layers 41.

Implanting Protons

Figure 11A:
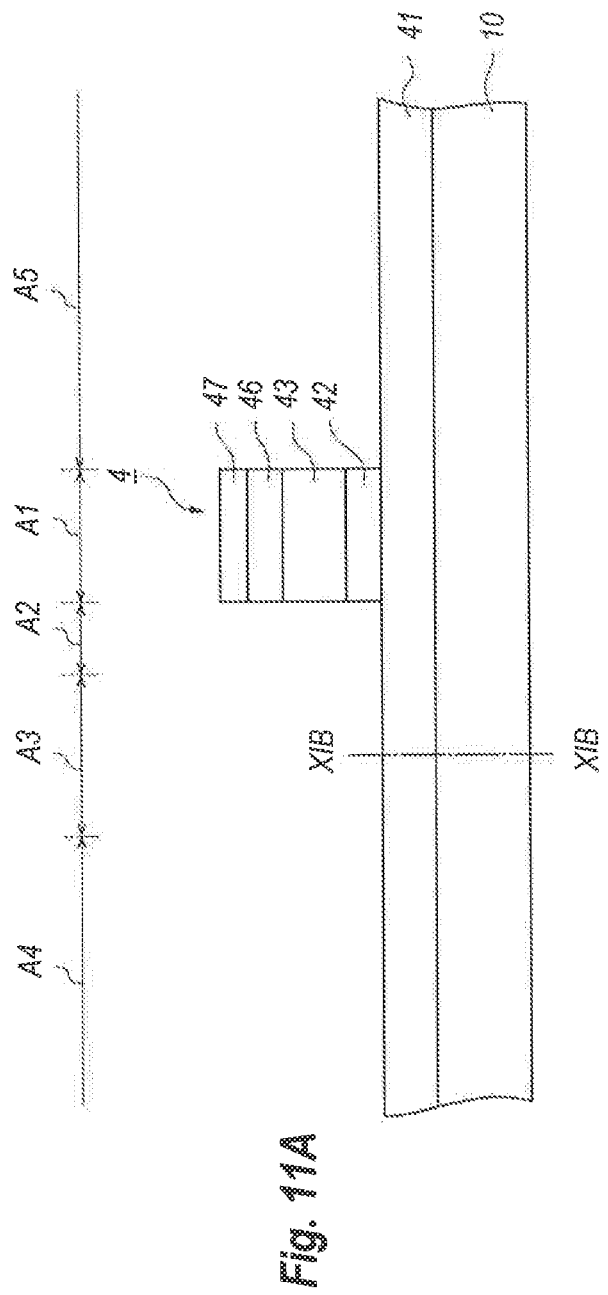
FIGS. 11A and 11B show a step of forming the modified layer by implanting protons in the first layer according to the third embodiment of the present invention.
Figure 11B:
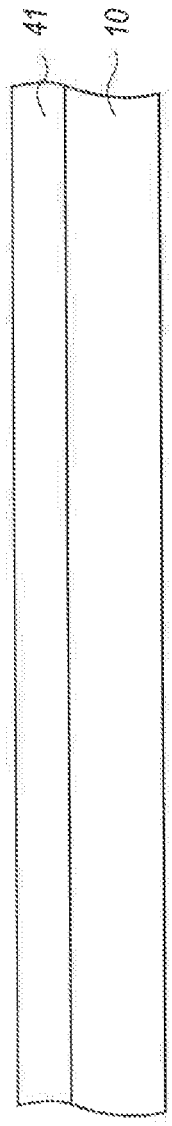

Next, another process $S_{3-2}$ of implanting protons will be described as referring to FIGS. 11A and 11B. The process $S_{3-2}$ first forms the mesa stripe 4 in advance to the implantation by steps same with those aforementioned step $S_{3-1}$. The mesa stripe 4, which is formed in the first area $A_1$, includes the second and third layers, 42 and 43, and the sixth layer 46 on the first layer 41.

Figures 12A, 12B:
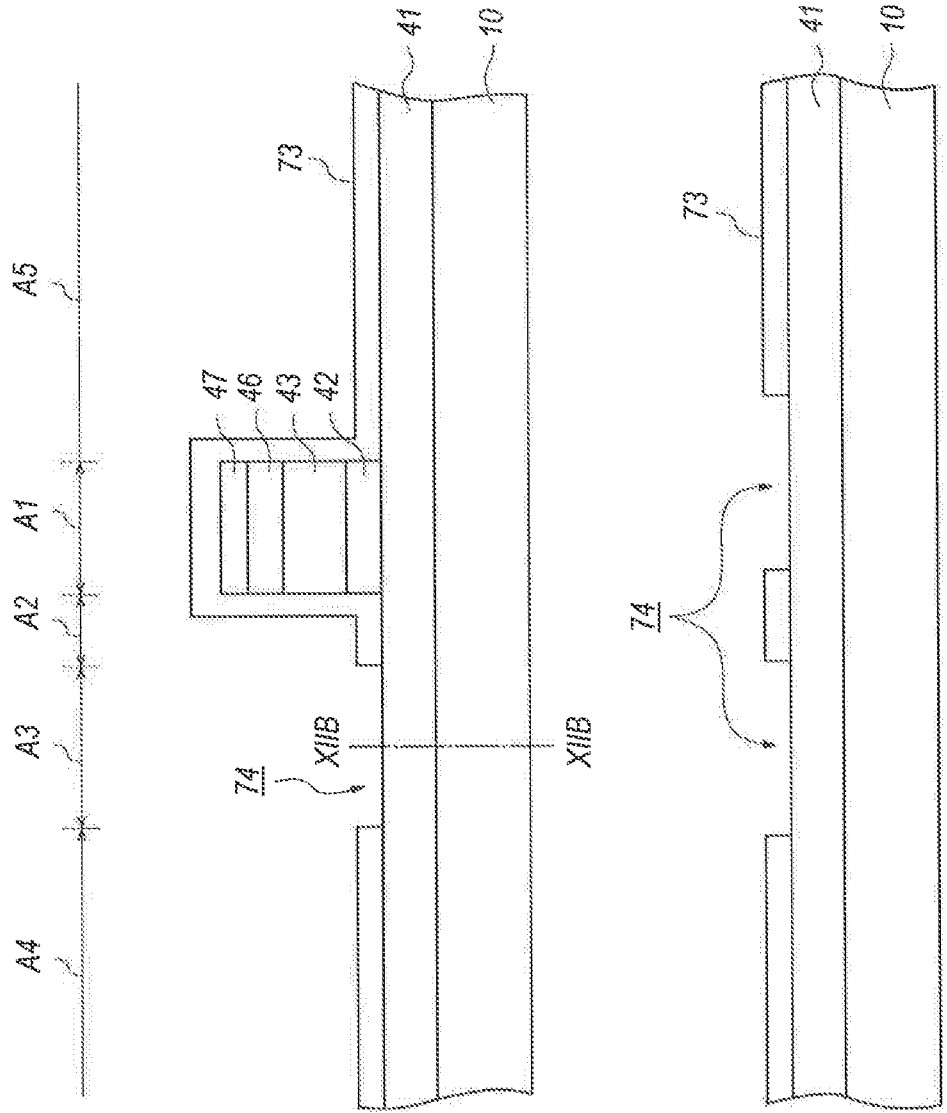
FIGS. 12A and 12B show a step of forming the semiconductor optical device performed subsequent to a step shown in FIGS. 11A and 12A.

Then, as shown in FIGS. 12A and 12B, a patterned mask 73 covers the mesa stripe 4 and a whole surface of the first layer 41 out of the third area $A_3$. That is, the patterned mask 73 provides openings 74 in the third area $A_3$. The patterned mask 73 may be formed by the photolithography for a photoresist and the opening 74 may be a rectangular or a square. Subsequently, the protons $H^+$ are implanted into the first layer 41 in the third area $A_3$ through the opening 74 to form the modified layer 50. The protons $H^+$ reach the substrate 10, that is, the range of the implantation exceeds the thickness of the first layer 41, as shown in FIGS. 13A and 13B; accordingly, the first layer 41 in a whole of the third area $A_3$ may be converted into the modified layer 50. Typical conditions of the proton implantation are:

| | |
|---|---|
| acceleration voltage | 80 to 200 keV |
| temperature | 350 to 400° C. |
| dosage | $1 \times 10^{15}$ to $3 \times 10^{15}$ $cm^{-2}$ |

The modified layer 50 which is implanted by the protons $H^+$ inherently shows high resistivity because the implanted protons $H^+$ becomes interstitials and/or induces defects in the first layer 41, which degrades the crystal quality and considerably increases resistivity of the first layer 41 compared with that in the first layer 41 in the second area $A_2$ and in the fourth area $A_4$. A layer with considerably high resistivity may be a conduction barrier and electrically isolate the first layers 41 in the second and fourth areas, $A_2$ and $A_4$. Thus, the proton implantation into the first layer 41 in the third area $A_3$ may form the modified layer 50 therein.

Thus, step $S_{3-1}$ of converting the conduction type and/or step $S_{3-2}$ of implanting protons may form the modified layer 50 and the mesa stripe 4.

Figure 14A:
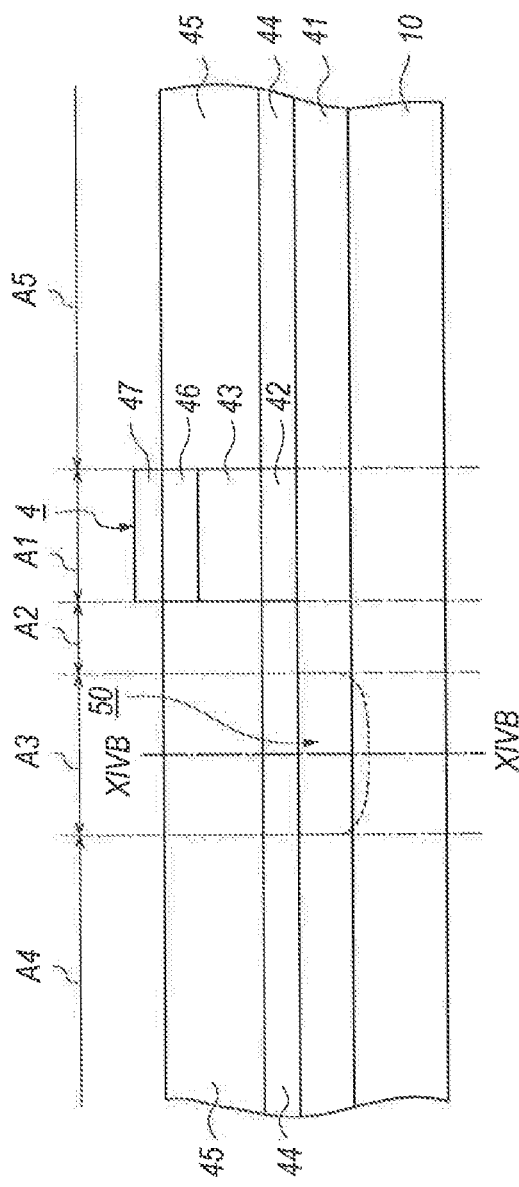
FIGS. 14A and 14B show a step of forming the semiconductor optical device performed subsequent to a step shown in FIGS. 13A and 13B.
Figure 14B:
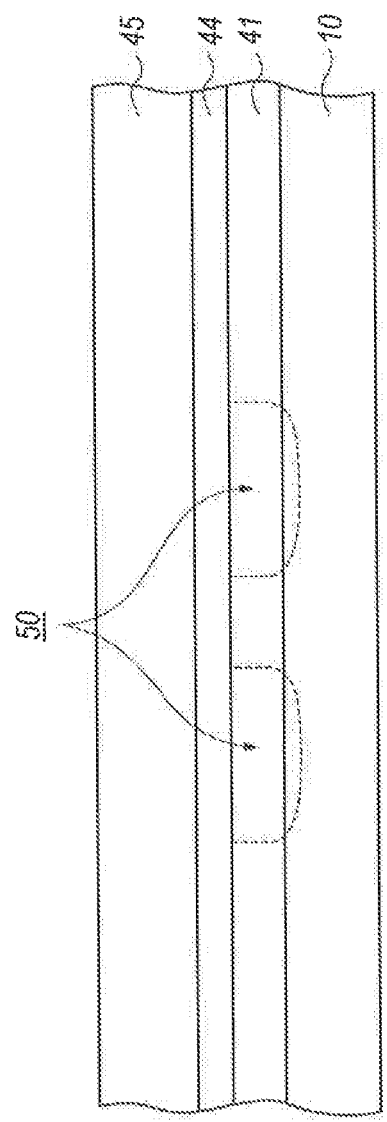

The process then performs re-growth of semiconductor layers, 44 and 45, without removing the patterned mask 47 for forming the mesa stripe 4 so as to form the semiconductor stack containing the fourth and fifth layers, 44 and 45, in the second to fifth areas, $A_2$ to $A_5$, as shown in FIG. 14A. The fourth and fifth layers, 44 and 45, in the second to fifth areas, $A_2$ to $A_5$, which are un-doped layers, are provided for the core layer 44 and the upper cladding layer 45, respectively. The fourth layer 44 butts against the second layer 42 in the first area $A_1$ and may have a thickness substantially equal to a thickness of the second layer 42. Also, the fifth layer 45 butts against the third layer 43 and the sixth layer 36 in the first area $A_1$ and may have a thickness substantially equal to a total thickness of the third layer 43 and the sixth layer 46. In an alternative, the forth layer 44 may be thicker than the second layer, for instance about 10% thicker than the second layer; while, the fifth layer 45 may have a thickness compensating the thickened forth layer 44 such that the top surface thereof is leveled with the top surface of the sixth layer 46. Thus, the fourth and fifth layers, 44 and 45, in the second area $A_2$ forms the butt-joint against the second to sixth layers, 42 to 46, in the first area $A_1$. Accordingly, the mesa stripe 4 is often called as the butt-joint mesa. The patterned mask 47, which is prepared to form the mesa stripe 4 and to embed the mesa stripe 4, is removed after the re-growth of the layers, 44 and 45, by a buffered hydrofluoric acid.

Forming PD Mesa and Waveguide Mesa

Step $S_4$ shown in FIGS. 15A and 15B patterns another mask 75 on the semiconductor stacks in the first to fifth areas, $A_1$ to $A_5$, where the patterned mask 75 determines a plane shape of the PD mesa 20M and a planar shape of the waveguide mesa 30. The patterned mask 75 may be made of silicon nitride (SiN). The process etches the fifth, fourth and a portion of the first layers or the modified layer, 45, 44, and 41 or 50, in the second to fifth areas, $A_2$ to $A_5$, also etches the sixth, third, second, and a portion of the first layers, 46, 43, 42, and 41, between the PD elements, 20a to 20d, in the first area $A_1$. Thus, the fourth layer 44, the fifth layer 45, and the first layer 41 in the second to fifth areas, $A_2$ to $A_5$, may operate as the core layer, the upper cladding layer, and the lower cladding layer in the waveguide mesa 30; while, the second layer 42, the third layer 43, the sixth layer 46, and the first layer 41 in the PD mesa 20M may operate as the absorption layer, the anode layer, the contact layer, and the cathode layer for the respective PD elements, 20a to 20d.

Passivating PD Mesa

Then, the process forms still another patterned mask 77 without removing the aforementioned mask 75 in step $S_5$ as shown in FIGS. 16A and 16B. The patterned mask 77, which may have a thickness of about 100 nm and may be made of silicon nitride (SiN), has an opening within which the PD mesa 20M is exposed, but covers the sides of the waveguide mesa 30 and a most surface of the first layer 41 in the fifth area $A_5$ except around the PD mesa 20M. A portion of the waveguide mesa 30 in the second area $A_2$ continuous to the PD mesa 20 is exposed in the sides thereof within the opening. Then, a Fe-doped InP 21 is selectively grown on the side of the PD mesa 20M and the surface of the first layer 41 exposed within the opening of the patterned mask 77; accordingly, the Fe-doped InP 21 reliably passivates the sides of the PD mesa 20M, which may reduce leak currents flowing from the third layer 43 (the anode layer) to the first layer 41 (the cathode layer) along the sides of the PD mesa 20M.

Forming Isolation Mesa

Step $S_6$ shown in FIGS. 17A and 17B removes the first layer 41 and a part of the substrate 10 around the PD mesa 20M and the waveguide mesa 30. Specifically, removing the patterned mask 75, another mask 76 made of silicon nitride (SiN) is patterned so as to cover the PD mesa 20M and the waveguide mesa 30. An etching may remove the first layer 41 around the PD mesa 20M and a part of the substrate 10 around the PD mesa 20M and the waveguide mesa 30 in the first to fifth areas, $A_1$ to $A_5$. Thus, because the first layer 41 left between the PD mesas 20M and between the waveguide mesas 30 may be removed; the isolated PD mesas 20M and the isolated waveguide mesas 30 may be obtained on the substrate 10.

Forming Insulating Layer and Electrodes

Step $S_7$ shown in FIGS. 18A and 18B forms an insulating layer 22, and anode and cathode electrodes, 51p and 51n, respectively. The insulating layer 22, which protects the PD mesa 20M and the waveguide mesa 30, may be made of inorganic material containing silicon (Si), typically, silicon nitride (SiN), silicon oxide (SiO$_2$), silicon oxy-nitride (SiON), and so on. The present embodiment provides the insulating layer 22 made of SiN deposited by the plasma-enhanced chemical vapor deposition (p-CVD) technique. The insulating layer 22 has a thickness of, for instance, 200 nm. Removing the insulating layer 22 partially so as to expose the top of the PD mesa 20M by the opening 23 and the first layer 41 in the side of the PD mesa 20M, the anode 51*p* and the cathode 51*n* are formed within the respective openings so as to be in contact to the six layer 46 in the top of the PD mesa 20M and the first layer 41 in the side of the PD mesa 20M, respectively. The anode 51*p* may be made of eutectic alloy of AuZn, or alloy containing platinum (Pt); while, the cathode 51*n* may be made of eutectic alloy of AuGe, or AuGe containing nickel (Ni). After the formation of the anode 51*p* and the cathode 51*n*, interconnections, 52*p* and 52*n*, for respective electrodes, 51*p* and 51*n*, are carried out. Thus, the process to form the semiconductor optical device 1 is completed.

FIG. 19 schematically illustrates a stacking arrangement of the semiconductor layers of the present invention. FIG. 19 assumes that the first layer 41 has the n-type conduction. The following table summarizes a typical configuration of the respective layers.

| | |
|---|---|
| substrate 10 | Fe-doped semi-insulating InP |
| first layer 41 | Si-doped InP operable as a cathode and a lower cladding layer |
| modified layer 50 | p-InP doped with p-type dopants, or InP implanted with protons |
| fourth layer 44 | undoped InGaAsP operable as a core layer |
| fifth layer 45 | undoped InP operable as an upper cladding layer |
| second layer 42 | undoped InGaAs operable as an absorption layer |
| third layer 43 | Zn-doped p-type InP operable as an anode |

When the first layer 41 shows the p-type conduction, the configuration of the respective layers, 41 to 45, may be exchanged between the n-type conduction and the p-type conduction. Also, the first layer 41 may be exchanged from Si-doped layer to Zn-doped layer, the second layer 42 may be exchanged from Zn-doped to Si-doped.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A semiconductor optical device, comprising:
a substrate made of semiconductor material;
a photodiode (PD) including a first layer, a second layer, and a third layer sequentially stacked on the substrate in this order, where the first layer, the second layer, and the third layer are made of semiconductor materials, the first layer being a cathode layer, the second layer being an absorption layer, and the third layer being an anode layer for the PD; and
an optical waveguide being continuous with the PD, the optical waveguide including a modified layer, a fourth layer, and a fifth layer sequentially stacked on the substrate in this order, the modified layer having a thickness substantially equal to a thickness of the first layer, the fourth layer butting against the second layer and having a bandgap wavelength shorter than a bandgap wavelength of the second layer, the fourth layer operating as a core layer, and the fifth layer operating as an upper cladding layer for the optical waveguide,
wherein the modified layer has a resistivity greater than a resistivity of the first layer, and
wherein the modified layer forms a barrier for carriers conducting in the first layer.

2. The semiconductor optical device claim 1,
wherein the modified layer is a semi-insulating layer.

3. The semiconductor optical device of claim 1,
wherein the PD forms a photodiode mesa including the first layer, the second layer, and the third layer, the photodiode mesa having respective sides passivated with semiconductor layers.

4. The semiconductor optical device of claim 1,
wherein the PD forms a photodiode mesa having respective sides, the photodiode mesa including the first layer, the second layer, and the third layer,
wherein the optical waveguide forms a waveguide mesa continuous with one of the sides of the photodiode mesa, the waveguide mesa including the modified layer, the fourth layer, and the fifth layer, and
wherein the substrate has an isolation mesa that surrounds the photodiode mesa.

5. The semiconductor optical device of claim 1, further including a multi-mode interference (MMI) coupler between the optical waveguide and the PD on the substrate,
wherein the optical waveguide optically couples the MMI coupler with the PD.

6. A semiconductor optical device, comprising:
a substrate made of semiconductor material;
a photodiode (PD) including a first layer, a second layer, and a third layer sequentially stacked on the substrate in this order, where the first layer, the second layer, and the third layer are made of semiconductor materials, the first layer providing a cathode layer, the second layer providing an absorption layer, and the third layer providing an anode layer for the PD; and
an optical waveguide being continuous with the PD, the optical waveguide including the first layer as converted to a modified layer, a fourth layer, and a fifth layer sequentially stacked on the substrate in this order, the modified layer having a thickness substantially equal to a thickness of the first layer, the fourth layer butting against the second layer and having a bandgap wavelength shorter than a bandgap wavelength of the second layer, the fourth layer providing a core layer and the fifth layer providing an upper cladding layer for the optical waveguide,
wherein the modified layer has a resistivity greater than a resistivity of the first layer, and
wherein the modified layer forms a barrier for carriers conducting in the first layer of the PD.

7. The semiconductor optical device of claim 6,
wherein the modified layer of the optical waveguide is a semi-insulating layer.

8. The semiconductor optical device of claim 6, wherein the PD forms a photodiode mesa including the first layer, the second layer, and the third layer, the photodiode mesa having respective sides passivated with semiconductor layers.

9. The semiconductor optical device of claim 6,
wherein the PD forms a photodiode mesa having respective sides, the photodiode mesa including the first layer, the second layer, and the third layer,
wherein the optical waveguide forms a waveguide mesa continuous with one of the sides of the photodiode mesa, the waveguide mesa including the modified layer, the fourth layer, and the fifth layer, and wherein the substrate has an isolation mesa that surrounds the photodiode mesa.

10. The semiconductor optical device of claim 6, further including a multi-mode interference (MMI) coupler between the optical waveguide and the PD on the substrate,
wherein the optical waveguide optically couples the MMI coupler with the PD.

* * * * *